United States Patent
Renavikar et al.

(10) Patent No.: US 8,409,929 B2
(45) Date of Patent: Apr. 2, 2013

(54) FORMING A SEMICONDUCTOR PACKAGE INCLUDING A THERMAL INTERFACE MATERIAL

(75) Inventors: Mukul Renavikar, Chandler, AZ (US); Daewoong Suh, Phoenix, AZ (US); Carl Deppisch, Chandler, AZ (US); Abhishek Gupta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/221,392

(22) Filed: Aug. 30, 2011

(65) Prior Publication Data

US 2011/0312131 A1 Dec. 22, 2011

Related U.S. Application Data

(62) Division of application No. 11/824,188, filed on Jun. 29, 2007, now Pat. No. 8,030,757.

(51) Int. Cl.
*H01L 21/00* (2006.01)
(52) U.S. Cl. ......... 438/121; 438/118; 438/122; 438/123
(58) Field of Classification Search .................. 438/118, 438/121, 122, 123
See application file for complete search history.

(56) References Cited

U.S. PATENT DOCUMENTS

| 7,081,669 | B2 | 7/2006 | Fitzgerald et al. | 257/707 |
| 2003/0007329 | A1 | 1/2003 | Hill | |
| 2004/0125563 | A1 | 7/2004 | Vrtis | |
| 2004/0200879 | A1* | 10/2004 | Lewis et al. | 228/56.3 |
| 2005/0006757 | A1 | 1/2005 | Rinella et al. | |
| 2005/0073816 | A1* | 4/2005 | Hill et al. | 361/708 |
| 2005/0121776 | A1 | 6/2005 | Deppisch et al. | 257/712 |
| 2005/0133934 | A1 | 6/2005 | Mellody et al. | 257/779 |
| 2007/0034305 | A1 | 2/2007 | Suh | |
| 2007/0131737 | A1 | 6/2007 | Renavikar et al. | 228/231 |
| 2008/0142954 | A1 | 6/2008 | Hu | |
| 2008/0165502 | A1* | 7/2008 | Furman et al. | 361/709 |
| 2009/0302280 | A1 | 12/2009 | Simone et al. | |

OTHER PUBLICATIONS

U.S. Appl. No. 11/278,337, filed Mar. 31, 2006, entitled "Coated Thermal Interface in Integrated Circuit Die," by Susheel Jadhav, et al.
U.S. Appl. No. 11/540,027, filed Sep. 29, 2006, entitled "Composite Solder TIM for Electronic Package," by Thomas Fitzgerald, et al.

* cited by examiner

*Primary Examiner* — Jae Lee
(74) *Attorney, Agent, or Firm* — Trop, Pruner & Hu, P.C.

(57) ABSTRACT

In one embodiment, the present invention includes a method for placing a thermal interface material (TIM) between a die including a backside metallic (BSM) layer including copper (Cu) and a heat spreader having a contact surface including Cu, where the TIM is formed of an alloy including indium (In) and tin (Sn), and bonding the TIM to the die and the heat spreader to form at least one quaternary intermetallic compound (IMC) layer. Other embodiments are described and claimed.

14 Claims, 2 Drawing Sheets ized by preferentially forming an IMC having a composition of (Cu, In, Au)$_6$Sn$_5$, in some embodiments.

FORMING A SEMICONDUCTOR PACKAGE INCLUDING A THERMAL INTERFACE MATERIAL

This application is a divisional of U.S. patent application Ser. No. 11/824,188, filed Jun. 29, 2007 now U.S. Pat. No. 8,030,757, the content of which is hereby incorporated by reference.

BACKGROUND

In today's semiconductor packages, a common packaging technology used is a so-called flip chip assembly in which a semiconductor die including a given component such as a processor, a chipset, memory, or the like, is coupled to a package substrate by interconnections such as conductive bumps, controlled collapse chip connection (C4) contacts or other such connections.

Because of the small size of the semiconductor die and its fast operating speeds, a great amount of heat may be generated. Accordingly, a semiconductor package typically includes a thermal solution such as an integrated heat spreader (IHS) which is typically adapted about the semiconductor die. Generally an interface material such as a thermal interface material (TIM) is coupled between the die backside and the IHS. Typically, the IHS is formed of a metal and the TIM may be a solder material such as indium (In). This TIM thus acts as a joint between the IHS and the die backside, which is typically a backside metal (BSM) layer.

Oftentimes, undesired effects exist at an interface between the TIM and the IHS, e.g., due to a reaction of metal plating on the IHS and the composition of the TIM. This can lead to interfacial delamination at the interface, potentially leading to failed devices, thermo-mechanical fatigue induced degradation and so forth. For example, an intermetallic compound (IMC) layer formed at the interface between TIM and IHS may form large scallops that can spall off during joint formation, leading to crack initiation and propagation during reliability testing, in turn increasing thermal resistance (Rjc) of the package, and causing failure of thermal requirements. Such effects become magnified at the smaller and thinner dimensions of current and future semiconductor devices.

DETAILED DESCRIPTION

In various embodiments, a TIM such as a solder TIM (STIM) may be formed using an alloy, such as an alloy including indium (In) and tin (Sn). Furthermore, the alloy may be simultaneously doped with another metal such as copper (Cu). Such compositions may help suppress/eliminate formation of scallops at an IMC between the STIM and IHS. Such suppression/elimination may be realized by preferentially forming an IMC that does not spall off from the underlying IHS lid. Furthermore, the IMC layer may be formed in the bulk STIM and thus reduce the impact of an interfacial IMC. Note that in some implementations the alloying and copper doping of the STIM may be performed in an indium ingot during melting.

Still further, the volume fraction of an undesired interface IMC, which may be a gold-indium (AuIn$_2$) layer, may be reduced by adding Cu to a plating layer on the IHS lid. In this way, undesired scallops may be suppressed/eliminated by preferentially forming an IMC having a composition of (Cu, In, Au)$_6$Sn$_5$, in some embodiments.

In certain embodiments, this preferential IMC may be enabled by modifying plating layers formed on an IHS, as well as a die backside. For example, a nickel-copper (Ni—Cu) material may be co-plated on an IHS lid. Still further, a similar Ni—Cu co-deposition may be used to form a BSM layer at a backside of the semiconductor die. In this way, suppression/elimination of an undesired IMC layer such as an AuIn$_2$ IMC may result in better STIM reliability, at least with regard to thermo-mechanical fatigue.

Figure 1:
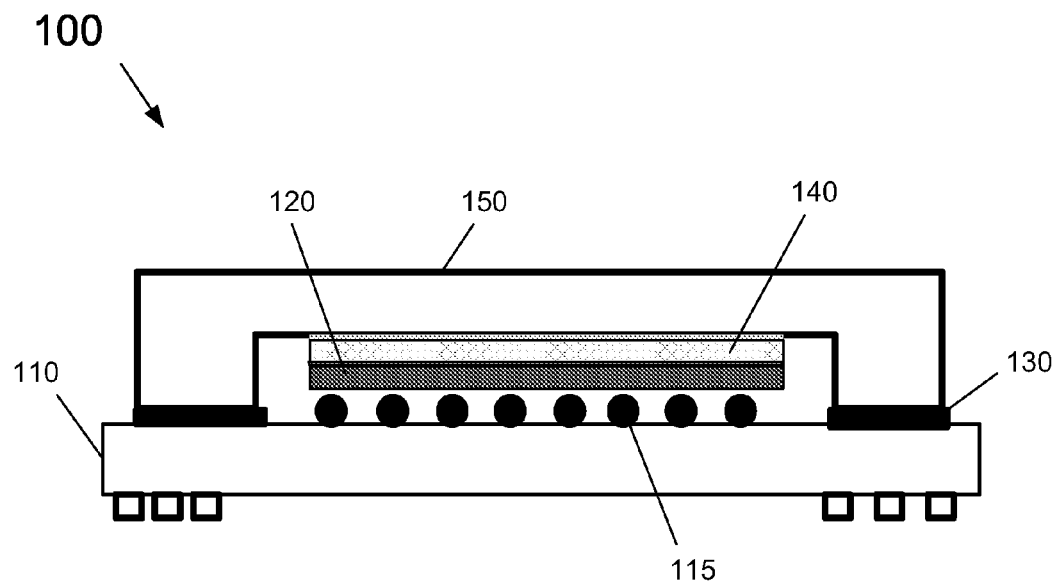
FIG. 1 is a cross-section view of a package in accordance with one embodiment of the present invention.

Referring now to FIG. 1, shown is a cross-section view of a package in accordance with one embodiment of the present invention. As shown in FIG. 1, package 100 may include a package substrate 110, which may provide data and power connections to/from package 100 to a system in which it is adapted. A semiconductor die 120 which may be a die including a processor, chipset, memory or any other semiconductor device is coupled to substrate 110 by a plurality of contacts 115, which in one embodiment may be C4 bumps.

An integrated heat spreader (IHS) 150 may be located above die 120. Specifically, a sealant 130 and a thermal interface material (TIM) 140 may be adapted on substrate 110 and die 120, respectively, and used to couple IHS 150 thereto. While not shown in the cross-section of FIG. 1, understand that various interfacial layers may be present between die 120 and TIM 140 and between TIM 140 and IHS 150, as well as possibly coating layers on TIM 140.

Figure 2:
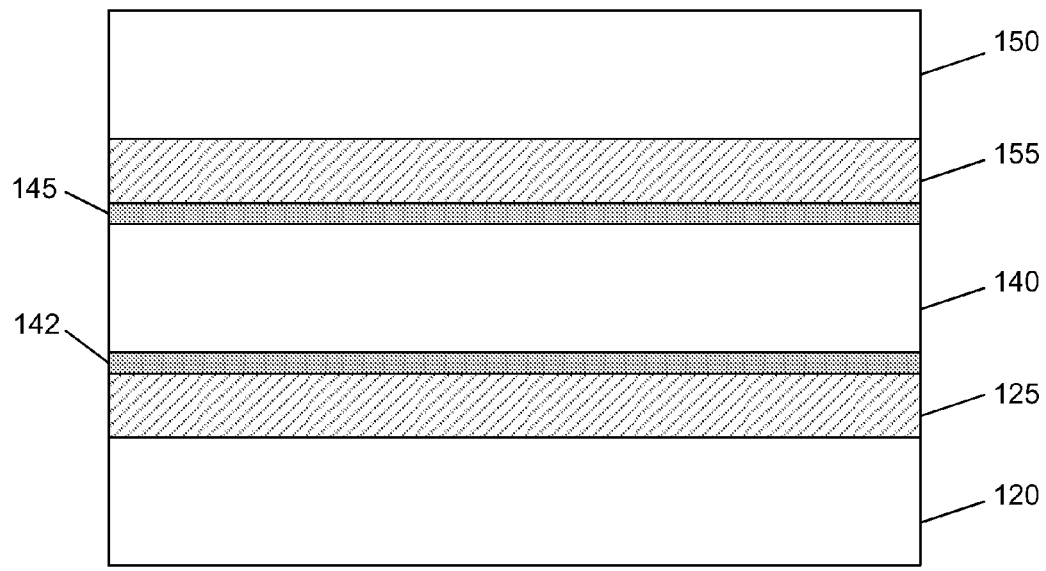
FIG. 2 is a close-up cross-sectional view of a thermal stack in accordance with one embodiment of the present invention.

Referring now to FIG. 2, shown is a close-up cross-sectional view of a thermal stack in accordance with one embodiment of the present invention. As shown in FIG. 2, die 120 has a backside metallic layer 125 which may be, in some embodiments a Ni—Cu BSM. The Ni—Cu layer on the BSM may be co-deposited using, for example, a physical vapor deposition (PVD).

In turn, STIM 140, which may be In—Sn (Cu) in some embodiments, may be adapted over die 120. Note that in the embodiment of FIG. 2, STIM 140 may include coating layers on both sides. For example, in some implementations metal layers 142 and 145 may be coating layers provided on STIM 140. In such embodiments, STIM 140 may include a core formed of, e.g., In—Sn (Cu), with layers 142 and 145, e.g., of a gold coating formed thereon. In some implementations, STIM 140 may have a thickness of between approximately 5 microns and 100 microns, while the thickness of coating layers 142 and 145 may be between approximately 0.1 microns and 0.5 microns. Such coating layers may prevent oxidation of STIM 140 without the need for use of a flux material, which may negatively impact bonding between components. The coating layers may be applied prior to placement of the TIM between die and IHS. Accordingly, a thinner STIM may be provided without producing voids in the thermal interface between the STIM and corresponding IHS and/or die.

In turn, IHS 150, which may be a copper IHS, may be adapted thereto. Note that IHS 150 may have a plating 155 on its lid which, in various embodiments may be Ni—Cu.

Note that the materials of the components shown in FIG. 2 may combine to form a combination of materials having an inter-metallic structure, i.e., inter-metallic compound (IMC) layers. For example, coating layers 142 and 145 on STIM 140 may form IMC layers with BSM layer 125 of die 120 and plating layer 155 of IHS 150.

The formed thermal stack shown in FIG. 2 (and FIG. 1) may be realized by performing a bonding process. Such a bonding process may be performed in an oxygen-free environment such as a nitrogen (N₂) environment. The bonding process may occur between approximately 155° Celsius (C) and 210° C., for a time period between several minutes to approximately 1 hour. As described above, this bonding process may be performed without the need for flux material.

While the scope of the present invention is not limited in this regard, in some embodiments, a STIM may be alloyed with up to approximately 10 weight % Sn, while it is simultaneously doped with approximately 1% Cu, although in other embodiments the Cu percentage may be up to approximately 3%. In this way, an IMC layer may be preferentially formed of (Cu, Au)₆(In, Sn)₅ to avoid spallation from a surface of an IHS to which the STIM is bonded. Note that such an IMC layer may also form in the bulk STIM to reduce the impact of an interfacial IMC layer formed of AuIn₂. This preferential IMC layer, which may be a quaternary IMC, is more adherent to an underlying substrate than an AuIn₂ layer, which may spall off after formation. A selection of a 10% weight Sn may be chosen so as to maintain a liquidus temperature of the STIM at approximately 145° C. and thus not hamper the temperature cycle performance of the STIM itself.

During reflow of the STIM, copper from the IHS and/or the BSM of the die may dissolve in the STIM to suppress formation of an AuIn₂ IMS by formation of an IMC layer of (Cu, Au)₆(In,Sn)₅. In various embodiments, the Ni—Cu coating on an IHS may include at least approximately 25 weight % Cu. Thus in various embodiments the copper present in IHS and/or die may be used to consume the gold as a preferential IMC rather than an imbrittling AuIn₂ IMC.

Figure 3:
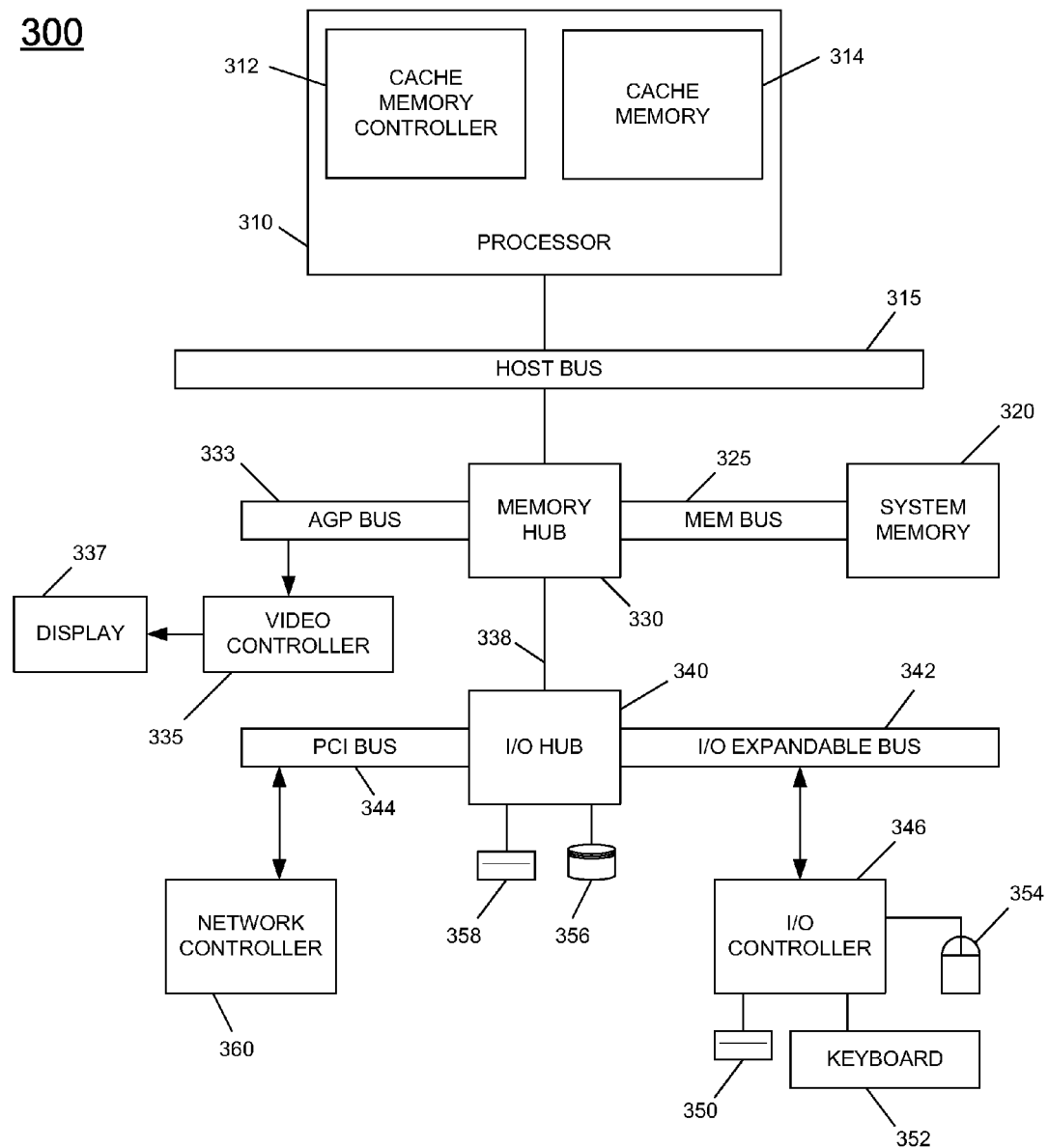
FIG. 3 is a block diagram of a system with which embodiments may be used.

Semiconductor packages in accordance with an embodiment may be used in various systems. FIG. 3 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 3, in one embodiment, computer system 300 includes a processor 310, which may include a general-purpose or special-purpose processor such as a microprocessor, microcontroller, a programmable gate array (PGA), and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. In one embodiment, processor 310 (at least) may include a STIM adapted between a die and IHS in accordance with an embodiment of the present invention and coupled, e.g., through a socket to a circuit board of system 300.

I/O expansion bus 342 may be coupled to an I/O controller 346 that controls access to one or more I/O devices. As shown in FIG. 3, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 3. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    adapting a die having a metallization structure on a backside thereof, the metallization structure including a first nickel-copper (Ni—Cu) layer on the backside, to a heat spreader formed of a conductive material and having a second Ni—Cu layer, via a thermal interface material (TIM) formed from an alloy including indium (In), tin (Sn) and copper (Cu), wherein a weight percentage of the Sn is less than about 10%, a weight percentage of the Cu is less than about 3%, and the TIM has a gold (Au) coating adapted on a first side and a second side thereof.

2. The method of claim 1, wherein the TIM has a thickness of less than about 100 microns.

3. The method of claim 1, further forming a first intermetallic compound (IMC) layer between the die and the TIM and a second IMC layer between the TIM and the heat spreader.

4. The method of claim 3, wherein each of the IMC layers is formed of (Cu, Au)₆(In, Sn)₅.

5. The method of claim 3, wherein each of the IMC layers comprises a quaternary compound.

6. A method comprising:
    adapting a semiconductor die having a metallization structure on a first side thereof, the metallization structure including a first nickel-copper (Ni—Cu) layer, to a heat spreader formed of a conductive material and having a contact surface covered with a second Ni—Cu layer, via a thermal interface material (TIM) formed of a core including indium (In), tin (Sn) and copper (Cu), the TIM having a weight percentage of the Cu of less than about 3%, and a weight percentage of the Sn of less than about 10%.

7. The method of claim 6, further comprising forming a first coating layer on a first side of the core, and forming a second coating layer on a second side of the core.

8. The method of claim 6, further comprising forming a quaternary intermetallic compound (IMC) layer of (Cu, Au)₆(In, Sn)₅.

9. The method of claim 8, further comprising suppressing an IMC layer of AuIn₂.

10. A method comprising:
    placing a thermal interface material (TIM) between a die including a backside metallic (BSM) layer including copper (Cu) and a heat spreader having a contact surface including Cu, wherein the TIM is formed of an alloy including indium (In), tin (Sn), and Cu, including forming the TIM alloy of less than approximately 10% weight Sn and less than approximately 3% weight Cu; and bonding the TIM to the die and the heat spreader, wherein the bonding is to reflow the TIM to form at least one quaternary intermetallic compound (IMC) layer.

11. The method of claim 10, further comprising:

coating a first surface of the TIM with a gold (Au) material to form a first coating layer; and coating a second surface of the TIM with the Au material to form second coating layer, wherein coating the first and second surfaces of the TIM is to occur before the TIM is placed between the die and the heat spreader.

12. The method of claim 10, wherein the bonding is performed in the absence of flux.

13. The method of claim 12, wherein the bonding is performed at a temperature between about 155° Celsius (C) and about 210° C.

14. The method of claim 10, wherein the BSM layer includes nickel (Ni) and Cu, and the contact surface of the heat spreader is a plated layer formed of Ni—Cu.

* * * * *